United States Patent [19]

Kurata et al.

[11] Patent Number: 5,690,731
[45] Date of Patent: Nov. 25, 1997

[54] METHOD OF GROWING SINGLE CRYSTAL

[75] Inventors: Yasushi Kurata; Kazuhisa Kurashige; Hiroyuki Ishibashi, all of Tsukuba, Japan

[73] Assignee: Hitachi Chemical Company Ltd., Japan

[21] Appl. No.: 413,288

[22] Filed: Mar. 30, 1995

[30] Foreign Application Priority Data

| Mar. 30, 1994 | [JP] | Japan | 6-059669 |
| Mar. 30, 1994 | [JP] | Japan | 6-059670 |
| Sep. 30, 1994 | [JP] | Japan | 6-236920 |

[51] Int. Cl.$^6$ ................................. C30B 15/20
[52] U.S. Cl. ...................... 117/13; 117/15; 117/28; 117/30
[58] Field of Search ............... 117/13, 15, 28, 117/30, 37, 39, 913, 937

[56] References Cited

FOREIGN PATENT DOCUMENTS

| 1164790 | 6/1989 | Japan | 117/13 |
| 4154690A | 5/1992 | Japan | 117/13 |

OTHER PUBLICATIONS

"Crystal Pulling Using ACPT"; Scheel, et al; J. of Cryst Growth 49 (1988) pp. 291–296.
"Crystal Rotation In Crystal Growth From Melt"; Scheel, et al; IBM Technical Disclosure Bulletin
Kazumasa Takagi and Mitsuru Ishii, "GGG" in 'Specimen Preparation and Machining' Experimental Physics Course, No. 13, Kyoritsu Shuppan Co., Ltd., 1981, pp.373 to 385.
B Cockayne and J.M. Roslington, "The Dislocation–Free Growth of Gadolinium Gallium Garnet Single Crystals" Journal of Materials Sciences 8, pp.601–605, 1973.

*Primary Examiner*—Felisa Garrett
*Attorney, Agent, or Firm*—Pennie & Edmonds

[57] ABSTRACT

A method of growing a crack-free single crystal is disclosed which comprises heating raw materials in a crucible to thereby obtain a melt of the raw materials, contacting a lower end of a seed crystal with the melt and pulling the seed crystal to thereby grow a single crystal, and wherein the melt of the crucible flows from its surface toward its inner part inside the crucible by convection at a position locating outside a region where the growth of the single crystal occurs. This flow control can be achieved by, for example, surrounding the crucible with a heat insulation refractory composed of a pair of semicylindrical refractories disposed so as to provide a circular cross section with differently sized gaps. In the above-mentioned method, the seed crystal may be rotated during a shoulder growth in which the single crystal has its diameter increased from that of the seed crystal to a target diameter at a rotation rate greater than that during a subsequent cylindrical body growth. Further, in the above-mentioned method, during the shoulder growth, the single crystal may have a solid-liquid interface configuration changed from a convex toward the melt to a flatness or a convex toward the seed crystal.

11 Claims, 1 Drawing Sheet

METHOD OF GROWING SINGLE CRYSTAL

BACKGROUND OF THE INVENTION

1. Field of The Invention

The present invention relates to a method of growing a single crystal. The single crystal is used in, for example, X-ray detectors as scintillators and other electronic equipments. More particularly, the present invention is concerned with a method of growing a single crystal in which the flow of a melt is conducted in a specified way, in which the seed crystal is rotated in a specified way, or in which the growth of the single crystal exhibits a specified solid-liquid interface change.

2. Description of Related Art

Conventionally, a single crystal of an oxide such as gadolinium oxyorthosilicate is grown by the method comprising heating raw materials corresponding to the composition of the grown single crystal in a crucible to thereby obtain a melt of the raw materials, contacting a lower end of a seed crystal with the melt and pulling the seed crystal to thereby grow the desired single crystal at the interface of the seed crystal and the melt (solid-liquid interface). This method is known as the Czochralski technique.

In the growth of the single crystal, the seed crystal is gradually pulled from the melt so that the crystal diameter is increased from the diameter of the seed crystal to a target one (shoulder growth). Once the target diameter is reached, the growth of the crystal is advanced with the diameter held constant to thereby grow a cylindrical body of the single crystal. Thus, the growth of the single crystal is attained.

In the method of growing a single crystal comprising heating a crucible by, for example, high-frequency induction to thereby melt the raw materials put in the crucible, contacting a lower end of a seed crystal with the melt and gradually pulling the seed crystal, often, the crucible is heated with the crucible arranged around the vertical and diametrical center of the high-frequency coil for improving the heating efficiency of the crucible. This heating involves a problem that the melt flows from its surface toward its inner part inside the crucible by convection at a position near the center of the crucible, so that metals of crucible materials and impurities which causes to form polycrystal, both having mingled into the melt stick to the seed crystal or single crystal grown from the seed crystal around the center of the crucible, resulting in polycrystal formation.

With respect to the rotation of the seed crystal conducted in pulling it, the rotation rate of the seed crystal during the shoulder growth, i.e., shoulder rotation rate is rendered equal to or lower than that during the subsequent cylindrical body formation because of the danger of melt separation (the seed crystal coming apart from the melt, or air coming into the interface thereof) (reference is made to Kazumasa Takagi and Mitsuru Ishii; Experimental Physics Course 13, specimen preparation and machining, page 381 (1981) published by Kyoritsu Shuppan Co., Ltd.).

However, in this method, the crystal diameter is enlarged in accordance with the advance of the shoulder growth, this diameter change causing change of the peripheral velocity of the grown shoulder, so that the solid-liquid interface configuration is markedly changed from the shoulder to the boundary of the shoulder and the cylindrical body. Thus, the problem occurs that the upper part of the crystal from the shoulder to the boundary of the shoulder and the cylindrical body captures strain, which becomes residual strain and causes cracks around the crystal shoulder in brittle crystals characterized by anisotropy in thermal expansion and cleaving properties during or after the cooling for crystal growth.

Further, with respect to the configuration of the solid-liquid interface in the above conventional single crystal growing method comprising contacting a seed crystal with a melt of raw materials and gradually pulling the seed crystal, the rotation during a shoulder growth is generally conducted until just before the cylindrical body formation under the rotation rate condition such that the solid-liquid interface configuration is not changed because holding the solid-liquid interface configuration convex toward the melt is advantageous for withdrawing dislocation at the surface of the crystal (see B. Cockayne and J. M. Roslington; J. Mater. Sci. 8 (1973), 601 and Experimental Physics Course 13, specimen preparation and machining, page 381 (1981) published by Kyoritsu Shuppan Co., Ltd.).

However, in this method, the solid-liquid interface configuration is not changed, and the crystal is grown in the state of being convex toward the melt. In the crystal grown in the state of being convex toward the melt, cooling to room temperature produces a tensile stress on the crystal surface due to residual strain. Further, when the solid-liquid interface is changed during the cylindrical body formation, the region of remelting (phenomenon in which crystallized center portion again melts due to a change of the interface configuration at the solid-liquid interface and recrystallizes depending on the interface configuration after the change) occurring at the time of the change is expanded, and strain is introduced because of lattice defects occurring there. The strain becomes residual strain and disadvantageously causes cracks around the crystal shoulder in brittle crystals characterized by anisotropy in thermal expansion and cleaving properties during or after the cooling for crystal growth.

SUMMARY OF THE INVENTION

With a view toward obviating the above drawbacks of the prior art, the inventors have made extensive and intensive studies. As a result, it has been found that an excellent single crystal can be produced without the above problems by causing the melt of the crucible to flow from, its surface toward its inner part inside the crucible by convection at a position locating outside a region where the growth of the single crystal occurs, or by rotating the single crystal during a shoulder growth in which the single crystal has its diameter increased from that of the seed crystal to a target diameter at a rotation rate greater than that during a subsequent cylindrical body growth, or by causing the single crystal to have during the shoulder growth a solid-liquid interface configuration changed from a convex toward the melt to a flatness or a convex toward the seed crystal. The present invention has been completed on the basis of the above unexpected finding.

It is, therefore, an object of the present invention to provide a method of growing a single crystal in which a melt flow is controlled so as to prevent polycrystal formation and thus cracking.

It is another object of the present invention to provide a method of growing a single crystal in which the rotation rate of a seed crystal is controlled, namely a melt flow is controlled so as to prevent cracking.

The foregoing and other objects, features and advantages of the present invention will become apparent from the following detailed description and appended claims taken in connection with the accompanying drawings.

In a first aspect of the present invention, it has been attained by studying the relationship between melt convection and polycrystal formation in a method of growing a single crystal comprising heating raw materials in a crucible by, for example, high-frequency induction to thereby obtain a melt of the raw materials, contacting a lower end of a seed crystal with the melt and pulling the seed crystal to thereby grow a single crystal, and by finding as a result of the study that the above-mentioned objects can be achieved by causing the melt of the crucible to flow from its surface toward its inner part inside the crucible by convection at a position locating outside a region where the growth of the single crystal occurs, for example, by directing the melt convection to a part of the wall of the crucible.

In particular, the invention has been attained by studying the relationship between the structure of a crucible surrounding refractory and polycrystal formation in a method of growing a single crystal comprising heating raw materials in a crucible by, for example, high-frequency induction to thereby obtain a melt of the raw materials, contacting a lower end of a seed crystal with the melt and pulling the seed crystal to thereby grow a single crystal, and by finding as a result of the study that crucible deformation can be minimized and polycrystal formation prevented by conducting the growth of the single crystal in a furnace provided with an intra-furnace heat insulation structure adapted to regulate said position outside the region where the growth of the single crystal occurs or by heating the melt of the crucible non-center-symmetrically so as to regulate said position outside the region where the growth of the single crystal occurs. In more particular, the crucible surrounding refractory may be composed of a cylindrical refractory having a longitudinal cut provided therein or composed of a pair of semicylindrical refractories disposed so as to provide a circular cross section with gaps, one (e.g., about 15 mm) being slightly greater than the other (e.g., 0–5 mm).

In a second aspect of the present invention, it has been attained by studying the conditions of shoulder growth accompanied by a diameter increase from the diameter of the seed crystal to a target diameter in a method of growing a single crystal comprising heating raw materials in a crucible to thereby obtain a melt of the raw materials, contacting a lower end of a seed crystal with the melt and pulling the seed crystal to thereby grow a single crystal, and by finding as a result of the study that the above-mentioned objects can be achieved by causing the rotation rate during the shoulder growth to be greater than that during the subsequent cylindrical body growth, depending on the diameter of the single crystal, to thereby hold the peripheral velocity constant or by rotating the seed crystal during the shoulder growth at a fixed rotation rate greater than the rotation rate during the subsequent cylindrical body growth.

In a third aspect of the present invention, it has been attained by studying the conditions of shoulder growth accompanied by a diameter increase from that of the seed crystal to a target diameter in a method of growing a single crystal comprising heating raw materials in a crucible to thereby obtain a melt of the raw materials, contacting a lower end of a seed crystal with the melt and pulling the seed crystal to thereby grow a single crystal, and by finding as a result of the study that the above-mentioned objects can be achieved by conducting the crystal growth at the rotation rate during shoulder growth such that the single crystal has a solid-liquid interface configuration changed from a convex toward the melt to a flatness or a convex toward the seed crystal.

It is more effective to apply the first, second and third aspects of the present invention jointly for attaining the first and second objects of the present invention.

The present invention is especially effective in the growth of a single crystal of an oxide such as cerium-doped gadolinium oxyorthosilicate.

However, the single crystal for use in the present invention is not limited to the single crystal of cerium-doped gadolinium oxyorthosilicate. The same effects as with the use of gadolinium oxyorthosilicate would be obtained with the use of another single crystal of a rare-earth silicate represented by the following general formula:

$$R_2SiO_5$$

wherein R represents at least one rare-earth element selected from the group consisting of La, Ce, Pr, Nd, Pm, Sm, Eu, Tb, Dy, Ho, Er, Tm, Yb, Lu, Y and Sc, in view of the similarity in the mechanical properties of the crystals.

Further, the same effects would be obtained even if the above-mentioned single crystal of rare-earth silicate is doped with a rare-earth element such as a transition metal of the iron group, for example, Cr.

According to the first aspect of the present invention, in a method of growing a single crystal comprising the steps of heating raw materials in a crucible, for example, by high-frequency induction to thereby obtain a melt of the raw materials, contacting a lower end of a seed crystal with the melt and pulling the seed crystal to thereby grow the single crystal, it is possible to prevent polycrystal formation by growing the single crystal under a condition where a melt convection flows downwardly toward a direction of the wall of the crucible, that is, a condition where a position into which the melt flows from its surface due to convection of the melt in the crucible is out of a region in which the single crystal grows. The reason why prevention possible is as follows.

When the melt of the crucible flows from its surface toward its inner part inside the crucible by convection at a position locating outside a region where the growth of the single crystal occurs, i.e., a position not around the center of the crucible but near the wall of the crucible, metals as crucible materials and impurities which causes to form polycrystal, both having mingled into the melt are caused to flow to the wall of the crucible by convection with the result that they stick to the crucible wall. Therefore, the sticking of the matter such as crucible composing metal which disturbs the regularity of the crystal growth to the seed crystal or grown crystal during seeding or crystal growth can be avoided to thereby prevent polycrystal formation. Further, the reason why polycrystal formation can be prevented by employing a crucible surrounding refractory composed of a cylindrical refractory having a longitudinal cut provided therein or composed of a pair of semicylindrical refractories disposed so as to provide a circular cross section with gaps, one being greater than the other in a method of growing a single crystal comprising heating raw materials in a crucible by, for example, high-frequency induction to thereby obtain a melt of the raw materials, contacting a lower end of a seed crystal with the melt and pulling the seed crystal to thereby grow a single crystal would be as follows.

When use is made of a cylindrical refractory disposed so as to center-symmetrically surround the crucible as in the prior art, a center-symmetric temperature distribution would be produced in the crucible by heating, so that the melt of the raw materials in the crucible would flow from its surface toward its inner part at the center of the crucible by convection. By contrast, when the crucible surrounding refractory is composed of a cylindrical refractory having a longitudinal cut provided therein or of a pair of semicylindrical refractories disposed so as to provide a circular cross section with differently sized gaps as in the present invention, a non-center-symmetric temperature distribution would be produced in the crucible by heating due to delicate temperature difference attributed to the cut or gaps, so that it would be feasible to change the above-mentioned convection inflow position, i.e., to cause the melt to flow by convection into the inner part at a position near the cut or gap along the wall of the crucible. As a result, metals as crucible materials and impurities which causes to form polycrystal, both having mingled into the melt are caused to flow to the wall of the crucible by convection with the result that they stick to the crucible wall. Therefore, their sticking to the seed crystal or grown crystal can be avoided to thereby prevent polycrystal formation.

Illustratively, it is preferred to implement at least one of the following measures:

(1) to surround the crucible with a heat insulation refractory, which is arranged non-center-symmetrically with respect to the crucible;

(2) to surround the crucible with a heat insulation refractory having a cut provided therein;

(3) to surround the crucible with a heat insulation refractory composed of a pair of semicylindrical refractories disposed so as to provide a circular cross section with differently sized gaps;

(4) to dispose the crucible non-center-symmetrically with respect to a coil for high-frequency induction heating so that the melt of the crucible is non-center-symmetrically heated; and (5) to employ a non-center-symmetrically shaped crucible.

By virtue of the single crystal growing method according to the first aspect of the present invention, polycrystal formation can be prevented even in crystals having a greater propensity to form polycrystals in a shoulder portion due to the mingling of crucible composing metals into the melt or the generation of polycrystal forming impurities. With respect to brittle crystals characterized by anisotropy in thermal expansion and cleaving properties, crystal cracking caused by polycrystals can be markedly reduced by preventing the generation of polycrystals.

Moreover, in repeated growths, the deformation of the crucible in a biased direction can be suppressed by employing a pair of semicylindrical refractories and by shifting the gap position relative to the periphery of the crucible upon each growing operation.

In connection with the second aspect of the present invention, the reason why cracking can be prevented by causing the rotation rate during the shoulder growth to be greater than that during the subsequent cylindrical body growth in a method of growing a single crystal comprising heating raw materials in a crucible to thereby obtain a melt of the raw materials, contacting a lower end of a seed crystal with the melt and pulling the seed crystal to thereby grow a single crystal would be as follows.

In the single crystal exhibiting a solid-liquid interface configuration convex toward the melt during the pulling thereof, the solid-liquid interface configuration is changed depending on the rotation rate and the crystal diameter, i.e., peripheral velocity. Although heating of the crucible causes the melt thereof to have convection from the wall of the crucible toward the center of the crucible, forced convection from the center toward the wall of the crucible is intensified by increasing the rotation rate of the seed crystal. The increase in rotation rate (peripheral velocity) causes the solid-liquid interface configuration to be nearly flat due to the effect of the forced convection. When the pulling of the crystal is conducted either at a fixed rotation rate or with the rotation rate of the shoulder lower than that of the cylindrical body, the shoulder grown from seeding up to initiation of the growth of the cylindrical body has a solid-liquid interface configuration convex toward the melt because its diameter is smaller than that of the cylindrical body to thereby cause the shoulder to have a lower peripheral velocity. Upon initiation of the pulling of the cylindrical body, the solid-liquid interface configuration becomes nearly flat and is no longer changed. Accordingly, a region where the solid-liquid interface configuration is rapidly changed from the shoulder growth to the initial stage of the growth of the cylindrical body is produced, thereby the phenomenon (remelting) that a portion crystallized at the solid-liquid interface remelts around the center thereof due to the change of the interface configuration and resolidifies with the changed interface configuration occurs (reference: as mentioned above). As a result, strain attributed to lattice defect is induced, which would cause cracking around the shoulder in brittle crystals.

This cracking can be prevented by causing the rotation rate during the shoulder growth to be greater than that during the subsequent cylindrical body growth, depending on the diameter of the single crystal, to thereby hold the peripheral velocity nearly constant or by rotating the seed crystal during the shoulder growth at a fixed rotation rate greater than the rotation rate during the subsequent cylindrical body growth to thereby render the solid-liquid interface configuration during the shoulder growth close to that during the cylindrical body growth so as to minimize the influence of the remelting and to uniformalize the solid-liquid interface configuration according to the technique of the present invention.

In connection with the third aspect of the present invention, the reason why cracking can be prevented by changing the solid-liquid interface configuration during the shoulder growth in a method of growing a single crystal comprising heating raw materials in a crucible to thereby obtain a melt of the raw materials, contacting a lower end of a seed crystal with the melt and pulling the seed crystal to thereby grow a single crystal would be as follows.

In the single crystal exhibiting a solid-liquid interface configuration convex toward the melt during the pulling thereof, the solid-liquid interface configuration is changed depending on the rotation rate and the crystal diameter, i.e., peripheral velocity. Although heating of the crucible causes the surface of the melt thereof to have convection from the wall of the crucible toward the center of the crucible, forced convection from the solid-liquid interface toward the wall of the crucible is intensified by increasing the rotation rate of the seed crystal. The increase in crystal diameter intensifies the forced convection, and at a certain point the forced convection predominates over the natural convection. Thus, a change causing the solid-liquid interface configuration to rapidly become flat occurs. At that time, the phenomenon known as remelting which a portion of the solid-liquid interface crystallized convexly toward the melt remelts occurs. The greater the rotation rate of the crystal or the smaller the diametrical temperature gradient of the melt, the smaller the diameter with which the change of the solid-liquid interface occurs.

Under the conventional growth conditions, the crystal is grown in the state of being convex toward the melt without the change of the solid-liquid interface configuration at the shoulder. In the crystal grown in the state of being convex toward the melt, cooling to room temperature would bring about residual strain, which would produce a tensile stress on the surface of the crystal. On the other hand, when the solid-liquid interface is changed after the initiation of the growth of the cylindrical body, not only does residual strain occur in the shoulder grown before the change but also the region of remelting occurring at the time of the change is increased, so that strain is introduced due to lattice defect having occurred there or the like. The strain remains as residual strain and disadvantageously causes cracks around the crystal shoulder in brittle crystals characterized by anisotropy in thermal expansion and cleaving properties during or after the cooling for crystal growth.

The solid-liquid interface can be changed with the crystal diameter as small as possible by increasing the rotation rate during the shoulder growth and by decreasing the temperature gradient of the melt according to the technique of the present invention. Thus, the region of growth effected with the solid-liquid interface held convex toward the melt is reduced, and the region of remelting effected at the time of change is reduced, so that residual strain is reduced, thereby preventing cracking. After the change of the solid-liquid interface, the rotation rate is decreased depending on the increase of the crystal diameter until the initiation of the growth of the cylindrical body, thereby preventing changes of the solid-liquid interface configuration (gradual change to become convex toward the crystal).

BRIEF DESCRIPTION OF THE DRAWINGS

In the drawings:

In FIGS. 1 and 2, like parts or portions are designated by like numerals.

PREFERRED EMBODIMENT OF THE INVENTION

The present invention will now be described in greater detail with reference to the following Examples and Comparative Examples, which should not be construed as limiting the scope of the invention.

Comparative Example 1

Herein, the growth of a single crystal of cerium-doped gadolinium oxyorthosilicate (Ce: $Gd_2SiO_5$ or "GSO") will be described as a typical comparative example.

About 3240 g of $Gd_2O_3$, about 560 g of $SiO_2$ and about 10 g of $CeO_2$ as raw materials were put in a crucible of Ir having a diameter of 100 mm and a height of 100 mm, and a single crystal of 50 mm in diameter and 180 mm in length was grown according to the Czochralski technique.

Figure 2:
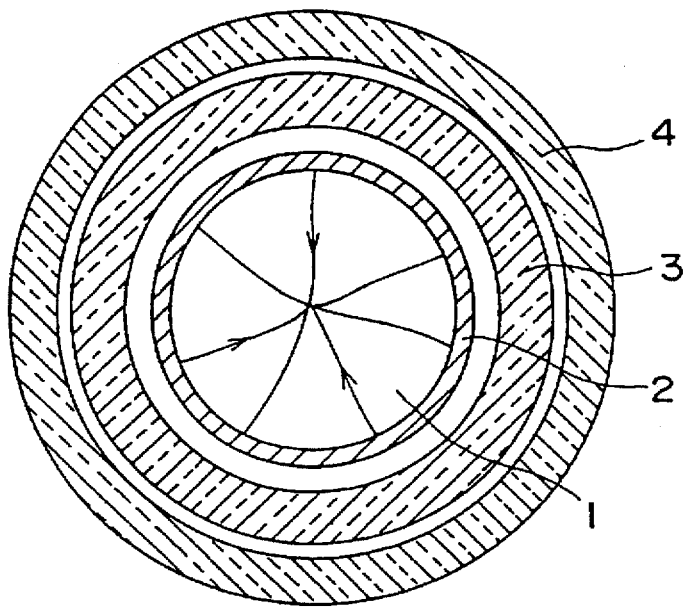
FIG. 2 is a sectional plan of a furnace for use in Comparative Example 1, showing the mode of convection of the melt in the crucible.

As shown in FIG. 2, the crucible 2 was surrounded by a crucible surrounding refractory 3, then by a refractory 4 and further by a high-frequency coil. The crucible 2 was set in a manner such that it was surrounded by the high-frequency coil with the upper end of the crucible 2 positioned 50 mm below the upper end of the coil and with the center of the crucible 2 positioned so as to agree with the center of the coil. FIG. 2 shows a plan view of the crucible 2, the refractories 3 and 4 which are sectioned on the plane parallel to and upper the surface of the melt 1. Arrows shown in the melt 1 indicate a direction of the convection. A cylindrical zirconia refractory of 125 mm in inner diameter, 155 mm in outer diameter and 120 mm in height was used as the crucible surrounding refractory, which was set so as for its center to agree with the center of the crucible 2.

The crucible 2 was heated by high-frequency induction, thereby melting the raw materials. The temperature of the melt 1 was controlled at about 2000° C. which was appropriate for seeding. As shown in FIG. 2, convection occurred by which the melt 1 flowed from the surface into the inner part at a position around the center of the crucible 2. A mass of Ir having mingled into the melt 1 floated at this position where the melt 1 flowed from the surface into the inner part by convection. This Ir was removed, and seeding was effected by contacting a lower end of a seed crystal with the melt while rotating the same at a rotation rate of 20 to 50 rpm. The seed crystal was pulled at a rate of 1 to 5 mm/hr to thereby grow a single crystal. Ir having newly occurred in the melt 1 was caused to move by convection, thereby adhering to the growing single crystal, during a shoulder formation for increasing the diameter of the single crystal to 50 mm. The pulling was continued to thereby obtain a body of single crystal having a length of about 180 mm. Thereafter, the single crystal was harvested by cutting and cooled over a period of about 50 hr to room temperature to thereby complete the growth of the single crystal. 10 single crystals were produced by the above-described method.

The occurrences of polycrystals and cracks were observed, and the results are shown in Table 1.

EXAMPLE 1

Figure 1:
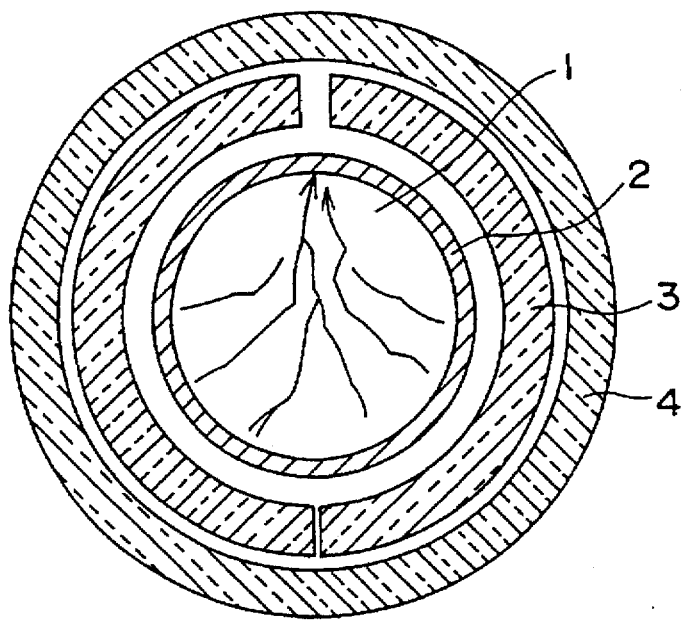
FIG. 1 is a sectional plan of a furnace for use in Example 1 of the present invention, showing the mode of convection of the melt in the crucible.

A single crystal of GSO was grown according to the Czochralski technique in substantially the same manner as in Comparative Example 1, except that the following crucible surrounding refractory was employed. FIG. 1 shows a plan view of the crucible 2, the refractories 3 and 4 which are sectioned on the plane parallel to and upper the surface of the melt 1. Arrows shown in the melt 1 indicate a direction of the convection. A cylindrical zirconia refractory of 125 mm in inner diameter, 155 mm in outer diameter and 120 mm in height was longitudinally halved, and the resultant two parts with semicircular cross sections were set as the crucible surrounding refractory 3 in a manner such that the semicircular cross sections joined each other with gaps, one (about 15 mm) being slightly greater than the other (0–5 mm), to form a circular cross section as shown in FIG. 1.

The crucible 2 was heated by high-frequency induction, thereby melting the raw materials, and the temperature of the melt 1 was controlled at one appropriate for seeding. As shown in FIG. 1, convection Occurred by which the melt 1 flowed from the surface into the inner part along the wall of the crucible 2 at a position near the above-mentioned greater gap. The convection moved any floating mass of Ir toward the wall of the crucible 2, thereby causing the Ir mass to adhere to the crucible wall. Thereafter, seeding was effected by contacting a lower end of a seed crystal with the melt while rotating the same at a rotation rate of 20 to 50 rpm. The seed crystal was pulled at a rate of 1 to 5 mm/hr to thereby grow a single crystal until the diameter of the single crystal increased to 50 mm. Even after the seeding, any Ir having mingled into the melt 1 and floating and any polycrystal nuclei having occurred in the melt 1 were carried by convection toward the wall of the crucible 2 and stuck to the crucible wall. Thus, their sticking to the growing single crystal was prevented. Thereafter, the pulling was continued to thereby obtain a body of single crystal having a length of about 180 mm, and the single crystal was harvested by cutting and cooled over a period of about 50 hr to room temperature to thereby complete the growth of the single crystal. 6 single crystals were produced by the above-mentioned method. In FIG. 1, numeral 4 denotes a refractory.

The occurrences of polycrystals and cracks were observed, and the results are shown in Table 1.

Table 1: Occurrences of polycrystals and cracks in single crystals of GSO

|  | Comp. Ex. 1 | Ex. 1 |
| --- | --- | --- |
| occurrence of polycrystals (no. of crystals with polycrystal/ total no. of crystals examined) | 10/10 | 0/6 |
| occurrence of cracks (no. of crystals with cracks/ total no. of crystals examined) | 10/10 | 2/6 |

It is apparent from Table 1 that, while polycrystals and cracks occur at a probability of 100% when the convection causes the melt to flow from the surface into the inner part around the center of the crucible (Comparative Example 1), the occurrence of polycrystals can be completely prevented and the occurrence of cracks can be markedly reduced when the convection causes the melt to flow from the surface into the inner part along the wall of the crucible at a part thereof by virtue of the unique structure of the crucible surrounding refractory (Example 1).

The same effect can be achieved by realizing a: non-center-symmetric convection, i.e., causing the melt of the crucible to flow from the surface into the inner part at a position lying outside the region of crystal growth.

Further, the same effect can also be achieved by employing a refractory having only a single longitudinal cut provided therein or a non-center-symmetrically shaped crucible or by disposing the crucible non-center-symmetrically with respect to the high-frequency heating coil.

EXAMPLE 2

Herein, the growth of a single crystal of cerium-doped gadolinium oxyorthosilicate (Ce: $Gd_2SiO_5$ or "GSO") conducted at a peripheral velocity held nearly constant during a shoulder formation will be described as an embodiment of the present invention.

About 3260 g of $Gd_2O_3$, about 540 g of $SiO_2$ and about 10 g of $CeO_2$ as raw materials were put in a crucible of Ir having a diameter of 100 mm and a height of 100 mm, and a single crystal of 50 mm in diameter and 180 mm in length was grown according to the Czochralski technique.

The crucible was heated by high-frequency induction, thereby melting the raw materials. A lower end of a seed crystal was contacted with the melt, and the seed crystal was pulled at a rate of 1 to 5 mm/hr to thereby grow a single crystal. The seed crystal was rotated at a rotation rate of 100 rpm from before the seeding. While the diameter of the single crystal was increased to 50 mm during the pulling of a crystal length of 30 to 50 mm by controlling the temperature of the melt, the rotation rate of the crystal was gradually dropped from 100 rpm to 30 rpm so that the peripheral velocity of the crystal was held nearly constant at 1.25 cm.sec., thereby forming a shoulder of single crystal. Thereafter, the diameter of the crystal was automatically controlled, and a cylindrical body of about 180 mm in length was pulled while holding, the rotation rate of the crystal at 30 rpm. Then, the single crystal was harvested by cutting and cooled over a period of about 50 hr to room temperature to thereby complete the growth of the single crystal. 10 single crystals were produced by the above-mentioned method.

The occurrence of cracks was observed, and the results are shown in Table 2.

EXAMPLE 3

Herein, the growth of a single crystal of cerium-doped gadolinium oxyorthosilicate (Ca: $Gd_2SiO_5$ or "GSO") conducted at a rotation rate held constant during a shoulder formation will be described as an embodiment of the present invention.

About 3260 g of $Gd_2O_3$, about 540 g of $SiO_2$ and about 10 g of $CeO_2$ as raw materials were put in a crucible of Ir having a diameter of 100 mm and a height of 100 mm, and a single crystal of 50 mm in diameter and 180 mm in length was grown according to the Czochraiski technique.

The crucible was heated by high-frequency induction, thereby melting the raw materials. A lower end of a seed crystal was contacted with the melt, and the seed crystal was pulled at a rate of 1 to 5 mm/hr to thereby grow a single crystal. The seed crystal was rotated at a rotation rate of 40 rpm from before the seeding. The diameter of the single crystal was increased to 50 mm during the pulling of a crystal length of 30 to 50 mm by controlling the temperature of the melt, thereby forming a shoulder. Thereafter, an automatic diameter control was initiated, and the rotation rate of the crystal was dropped to 30 rpm. A cylindrical body of about 180 mm in length was pulled, and the single crystal was harvested by cutting and cooled over a period of about 50 hr to room temperature.

The occurrence of cracks was observed, and the results are shown in Table 2.

Comparative Example 2

For comparison, single crystals were grown at individually fixed rotation rates of 25 rpm during the shoulder formation and 30 rpm during the cylindrical body formation (1) and at individually fixed rotation rates of 30 rpm during the shoulder formation and 30 rpm during the cylindrical body formation (2) according to the method of the prior art.

The occurrences of cracks were observed, and the results are shown in Table 2.

TABLE 2

Occurrence of cracks in single crystals of GSO

|  | Comp. Ex. 2 | | Ex. 2 | Ex. 3 |
| --- | --- | --- | --- | --- |
|  | (1) | (2) | | |
| rotation rate during shoulder formation (rpm) | 25 | 30 | 100–30 | 40 |
| rotation rate during cylindrical body formation (rpm) | 30 | 30 | 30 | 30 |
| occurrence of cracks | present | present | none | none |

It is apparent from Table 2 that, while cracks occur when the rotation rate during the shoulder formation is equal to or smaller than the rotation rate during the cylindrical body formation according to the method of the prior art (Comparative Example 2), cracks can be prevented by rendering the rotation rate during the shoulder formation greater than the rotation rate during the cylindrical body formation, the rotation rate during the shoulder formation being either fixed or varied depending on the increase of the diameter of the crystal so that the peripheral velocity is held nearly constant, according to the present invention (Examples 2 and 3).

EXAMPLE 4

Herein, the growth of a single crystal of cerium-doped gadolinium oxyorthosilicate (Ce: $Gd_2SiO_5$ or "GSO") will be described as an embodiment of the present invention.

About 3260 g of $Gd_2O_3$, about 540 g of $SiO_2$ and about 10 g of $CeO_2$ as raw materials were put in a crucible of Ir having a diameter of 100 mm and a height of 100 mm, and a single crystal of 50 mm in diameter and 180 mm in length was grown according to the Czochralski technique.

The crucible was heated by high-frequency induction, thereby melting the raw materials. A lower end of a seed crystal was contacted with the melt, and the seed crystal was pulled at a rate of 1 to 5 mm/hr to thereby grow a single crystal. The seed crystal was rotated at a rotation rate of 40 rpm from before the seeding. The diameter of the single crystal was increased to 50 mm during the pulling of a crystal length of 30 to 50 mm by controlling the temperature of the melt, thereby forming a shoulder. When the diameter of the crystal was about 40 mm, the solid-liquid interface was changed, so that the configuration thereof changed from convex toward the melt to flat. Thereafter, while the diameter of the crystal was increased to 50 mm, the rotation rate of the crystal was dropped to 30 rpm. Then, an automatic diameter control was initiated, and a cylindrical body of about 180 mm in length was pulled. The single crystal was harvested by cutting and cooled over a period of about 50 hr to room temperature.

The occurrence of cracks was observed, and the results are shown in Table 3.

EXAMPLE 5

Herein, the growth of a single crystal of cerium-doped gadolinium oxyorthosilicate (Ce: $Gd_2SiO_5$ or "GSO") will be described as an embodiment of the present invention.

As in Example 4, the crucible was heated by high-frequency induction, thereby melting the raw materials. A lower end of a seed crystal was contacted with the melt, and the seed crystal was pulled at a rate of 1 to 5 mm/hr to thereby grow a single crystal. The seed crystal was rotated at a rotation rate of 50 rpm from before the seeding. The diameter of the single crystal was increased to 50 mm during the pulling of a crystal length of 30 to 50 mm by controlling the temperature of the melt, thereby forming a shoulder. When the diameter of the crystal was about 25 mm, the solid-liquid interface was changed, so that the configuration thereof changed from a convex toward the melt to flat. Thereafter, while the diameter of the crystal was increased to 50 mm, the rotation rate of the crystal was dropped to 30 rpm. Then, an automatic diameter control was initiated, and a cylindrical body of about 180 mm in length was pulled. The single crystal was harvested by cutting and cooled over a period of about 50 hr to room temperature.

The occurrence of cracks was observed, and the results are shown in Table 3.

Comparative Example 3

Herein, the growth of a single crystal of cerium-doped gadolinium oxyorthosilicate (Ce: $Gd_2SiO_5$ or "GSO") will be described as a typical comparative example.

About 3260 g of $Gd_2O_3$, about 540 g of $SiO_2$ and about 10 g of $CeO_2$ as raw materials were put in a crucible of Ir having a diameter of 100 mm and a height of 100 mm, and a single crystal of 50 mm in diameter and 180 mm in length was grown according to the Czochralski technique.

The crucible was heated by high-frequency induction, thereby melting the raw materials. A lower end of a seed crystal was contacted with the melt, and the seed crystal was pulled at a rate of 1 to 5 mm/hr to thereby grow a single crystal. The seed crystal was rotated at a rotation rate of 20 rpm from before the seeding. The diameter of the single crystal was increased to 50 mm during the pulling of a crystal length of 30 to 50 mm by controlling the temperature of the melt, thereby forming a shoulder. During the shoulder formation, no change of the solid-liquid interface occurred. While holding the rotation rate of the crystal at 20 rpm, an automatic diameter control was initiated, and a cylindrical body of about 180 mm in length was pulled. The single crystal was harvested by cutting and cooled over a period of about 50 hr to room temperature. During the growth of the cylindrical body of the crystal as well, no change of the solid-liquid interface occurred, so that the grown crystal had a tail configuration convex toward the melt (downward). The occurrence of cracks was observed, and the results are shown in Table 3.

Comparative Example 4

Herein, the growth of a single crystal of cerium-doped gadolinium oxyorthosilicate (Ce: $Gd_2SiO_5$ or "GSO") will be described as a typical comparative example.

As in Comparative Example 3, the crucible was heated by high-frequency induction, thereby melting the raw materials. A lower end of a seed crystal was contacted with the melt, and the seed crystal was pulled at a rate of 1 to 5 mm/hr to thereby grow a single crystal. The seed crystal was rotated at a rotation rate of 30 rpm from before the seeding. The diameter of the single crystal was increased to 50 mm during the pulling of a crystal length of 30 to 50 mm by controlling the temperature of the melt, thereby forming a shoulder. During the shoulder formation, no change of the solid-liquid interface occurred. While holding the rotation rate of the crystal at 30 rpm, an automatic diameter control was initiated, and a cylindrical body of about 180 mm in length was pulled. The single crystal was harvested by cutting and cooled over a period of about 50 hr to room temperature. Immediately after the initiation of the automatic diameter control, an change of the solid-liquid interface occurred (at the top of the cylindrical body), so that the grown crystal had a flat tail configuration and that a large number of voids were observed at the position where the change would have taken place.

The occurrence of cracks was observed, and the results are shown in Table 3.

TABLE 3

Occurrence of cracks in single crystals of GSO

| | Comp. Ex. 3 | Comp. Ex. 4 | Ex. 4 | Ex. 5 |
|---|---|---|---|---|
| rotation rate during shoulder formation (rpm) | 20 | 30 | 40–30 | 50–30 |
| rotation rate during cylindrical body formation (rpm) | 20 | 30 | 30 | 30 |
| position of change of solid-liquid interface (diam. mm) | none | 50 | 40 | 25 |

TABLE 3-continued

Occurrence of cracks in single crystals of GSO

|  | Comp. Ex. 3 | Comp. Ex. 4 | Ex. 4 | Ex. 5 |
|---|---|---|---|---|
| occurrence of cracks (no. of crystals with cracks/total no. of crystals examined) | 3/3 | 5/6 | 1/4 | 0/5 |

It is apparent from Table 3 that, while cracks occur at a probability of nearly 100% in the method of the prior art in which the solid-liquid interface is not changed in the shoulder, little cracks occur in the method of the present invention in which the rotation rate during the shoulder formation is increased and in which the solid-liquid interface is changed during the shoulder formation, and that positioning the change of the solid-liquid interface in a smaller crystal diameter leads to a tendency toward complete prevention of cracks.

What is claimed is:

1. A method of growing a single crystal, comprising the steps of:
    a) heating raw materials in a crucible to obtain a melt of the raw materials;
    b) contacting a lower end of a seed crystal with a surface of the melt; and
    c) lifting the seed crystal to grow a single crystal, wherein the temperature in said crucible is regulated so that the melt flows from the surface of the melt toward the inside of the melt by convection within a region of said surface of the melt which is not in contact with said single crystal.

2. A method of growing a single crystal as defined in claim 1, wherein the temperature in said crucible is regulated by an intra-furnace heat insulation structure for growing a single crystal.

3. A method of growing a single crystal as defined in claim 1, wherein the temperature in said crucible is regulated by making said heating nonuniform.

4. A method of growing a single crystal having a cylindrical body with a fixed final diameter, comprising the steps of:
    a) heating raw materials in a crucible to obtain a melt of the raw materials;
    b) contacting a lower end of a seed crystal with a surface of the melt; and
    c) lifting the seed crystal, while rotating the seed crystal, to grow a single crystal,
    wherein said step (c) is a step in which, after the diameter of said single crystal is enlarged to be equal to the fixed final diameter of said cylindrical body, the rotational speed is reduced to grow said cylindrical body.

5. A method of growing a single crystal as defined in claim 4, wherein said seed crystal is rotated at a fixed rotational speed when enlarging the diameter of said single crystal to be equal to that of the fixed final diameter of said cylindrical body.

6. A method of growing a single crystal comprising the steps of:
    (a) heating raw materials is a crucible to obtain a melt of the raw material;
    (b) contacting a lower end of a seed crystal with a surface of the melt; and
    (c) lifting the seed crystal, while rotating the seed crystal to grow a single crystal, wherein the rotational speed of the seed crystal is controlled so that a peripheral velocity of said single crystal undergoing growth is fixed.

7. A method of growing a single crystal having a cylindrical body with a fixed final diameter, comprising the steps of:
    a) heating raw materials in a crucible to obtain a melt of the raw materials;
    b) contacting a lower end of a seed crystal with a surface of the melt; and
    c) lifting the seed crystal, while rotating the seed crystal, to grow a single crystal, wherein:
        i) a solid-liquid interface configuration between the single crystal and said melt is changed from a protrusion toward the melt to a flat shape or a protrusion toward the seed crystal while enlarging the diameter of said single crystal to be equal to that of said cylindrical body; and; and
        ii) thereafter growing said cylindrical body of said single crystal.

8. A method of growing a single crystal as defined in claim 7, wherein said rotational speed of said seed crystal is reduced after said solid-liquid interface configuration is changed.

9. A method of growing a single crystal, comprising the steps of:
    a) heating raw materials in a crucible to obtain a melt of the raw materials;
    b) contacting a lower end of a seed crystal with a surface of the melt; and
    c) lifting the seed crystal, while rotating the seed crystal, to grow a single crystal, wherein the rotational speed of the seed crystal is reduced when the single crystal reaches a diameter within 50% of an inner diameter of the crucible, wherein said reduced speed is sufficient to grow a cylindrical body of the single crystal.

10. A method of growing a single crystal as defined in claim 9, wherein said seed crystal is rotated at a first rotational speed sufficient to grow a single crystal of a diameter within 50% of the inner diameter of the crucible, and after the crystal reaches said diameter, said crystal is rotated at a second rotational speed, which is slower than the first rotational speed and is sufficient to grow a cylindrical body of the single crystal.

11. A method of growing a single crystal, comprising the steps of:
    a) heating raw materials in a crucible to obtain a melt of the raw materials;
    b) contacting a lower end of a seed crystal with a surface of the melt; and
    c) lifting the seed crystal, while rotating the seed crystal, to grow a single crystal, wherein:
        i) a solid-liquid interface configuration between the single crystal and said melt is changed from a protrusion toward the melt to a flat shape or a protrusion toward the seed crystal before the single crystal reaches a diameter within 50% of an inner diameter of the crucible; and
        ii) growing of a cylindrical body of said single crystal starts after the single crystal reaches said diameter.

* * * * *